(12) United States Patent
Nishimura et al.

(10) Patent No.: US 7,133,116 B2
(45) Date of Patent: Nov. 7, 2006

(54) DEFECT MITIGATION IN SPATIAL LIGHT MODULATOR USED FOR DYNAMIC PHOTOLITHOGRAPHY

(75) Inventors: Ken A. Nishimura, Fremont, CA (US); Dale W. Schroeder, Scotts Valley, CA (US); Charles D. Hoke, Menlo Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 94 days.

(21) Appl. No.: 10/736,724

(22) Filed: Dec. 15, 2003

(65) Prior Publication Data

US 2005/0128457 A1  Jun. 16, 2005

(51) Int. Cl.
*G03B 27/54* (2006.01)
*G03B 27/42* (2006.01)

(52) U.S. Cl. .......................................... 355/67; 355/53

(58) Field of Classification Search .................. 355/53, 355/67–71; 430/5, 20, 30; 359/292
See application file for complete search history.

(56) References Cited

U.S. PATENT DOCUMENTS

| 5,721,622 | A  | * | 2/1998  | Venkateswar | .............. | 358/3.01 |
| 6,312,134 | B1 | * | 11/2001 | Jain et al.  | .................. | 359/855  |
| 6,544,698 | B1 | * | 4/2003  | Fries         | .......................... | 430/22   |
| 6,606,739 | B1 | * | 8/2003  | Kanatake et al. | ............. | 716/21   |
| 6,618,185 | B1 | * | 9/2003  | Sandstrom     | .................. | 359/292  |
| 2005/0046819 | A1 | * | 3/2005  | Bleeker et al. | ............... | 355/67   |

* cited by examiner

*Primary Examiner*—Henry Hung Nguyen

(57) ABSTRACT

A spatial light modulator for use in a photolithography system includes light modulation elements configured to photolithographically transfer an image onto a substrate using an optical oversampling technique to reduce defects in the transferred image. A first set of the light modulation elements is operable to photolithographically transfer a portion of the image onto an area of a substrate, and a second set of the light modulation elements is operable to photolithographically transfer the portion of the image onto the area of the substrate. The spatial light modulator further includes memory elements in communication with respective light modulation elements for storing data representing the portion of the image.

25 Claims, 9 Drawing Sheets

FIG. 3

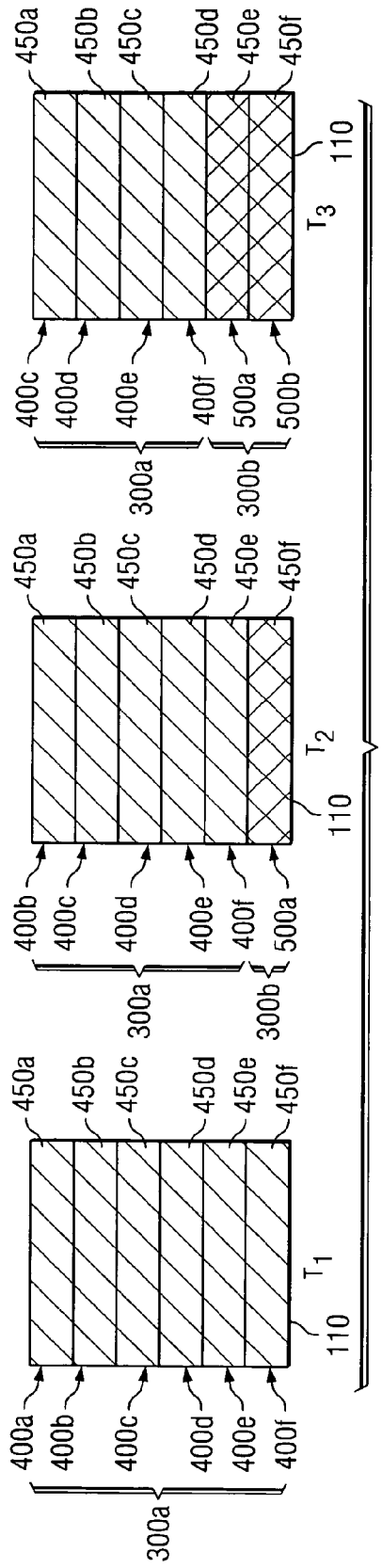
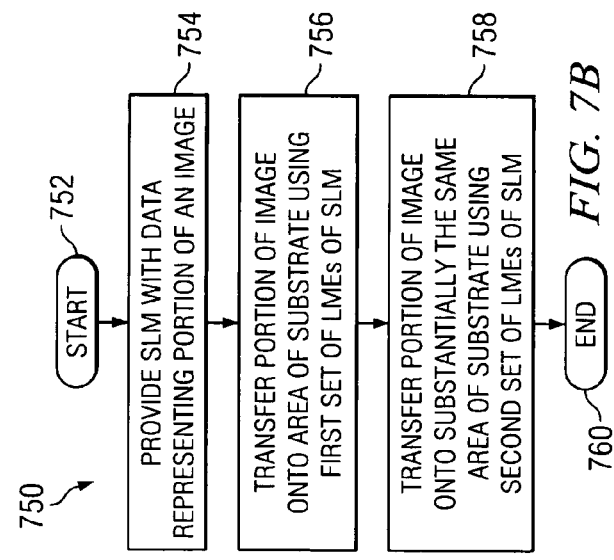
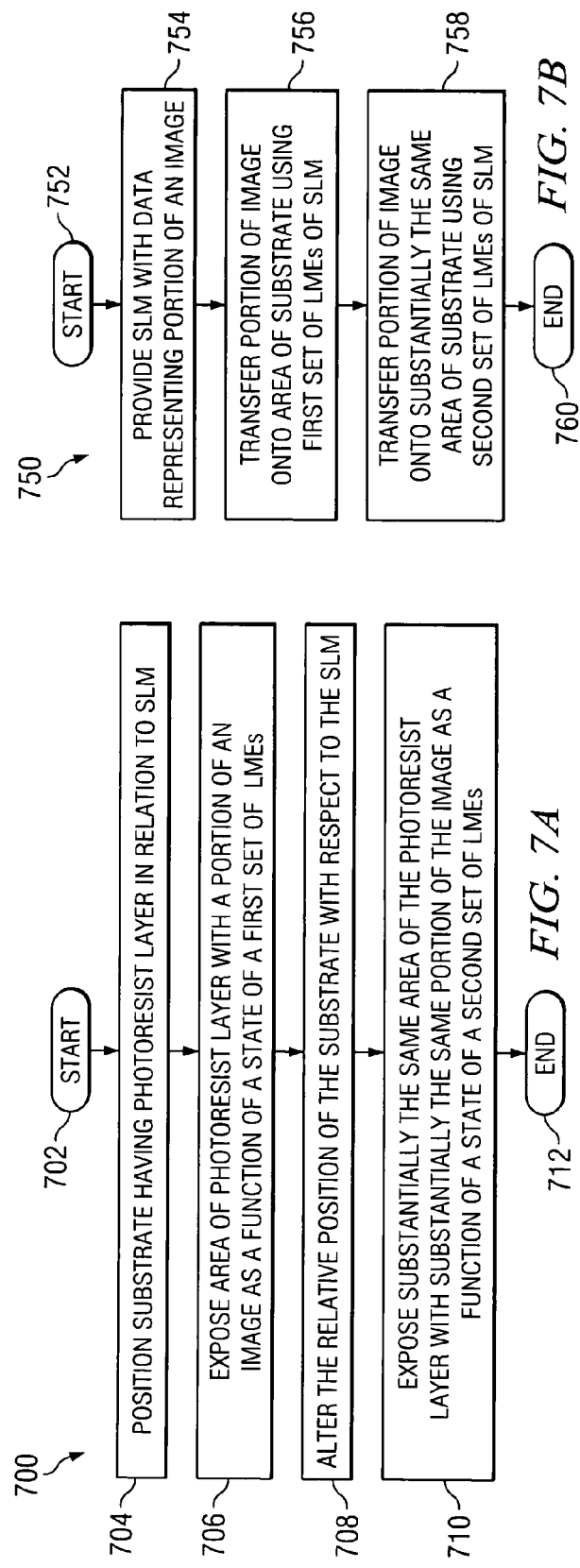

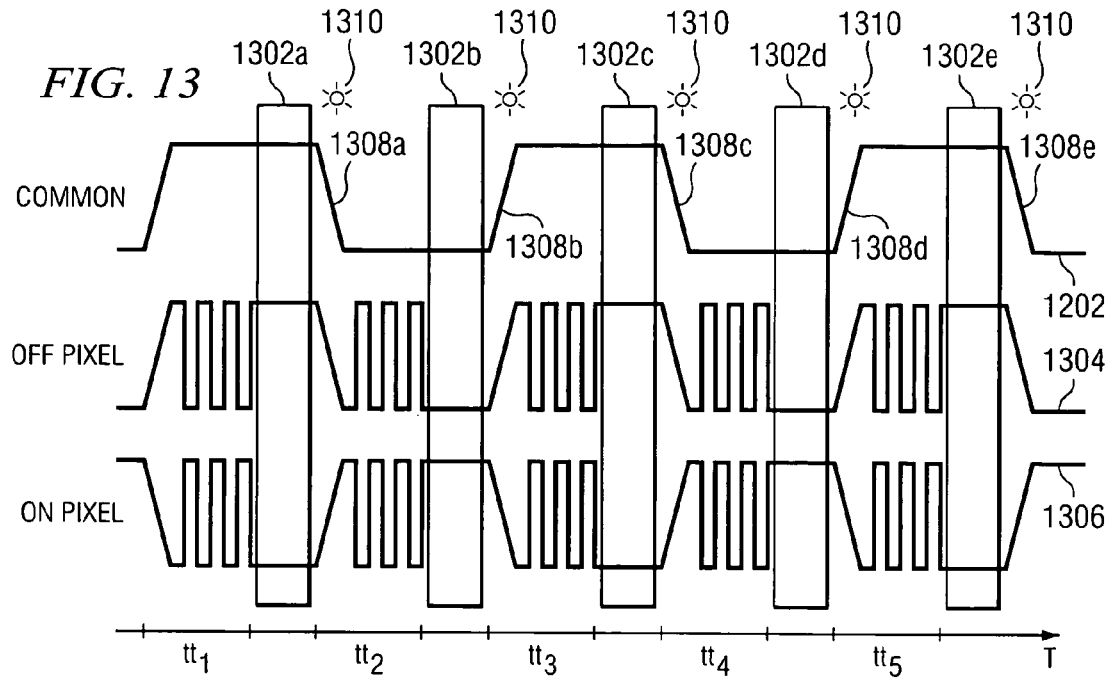
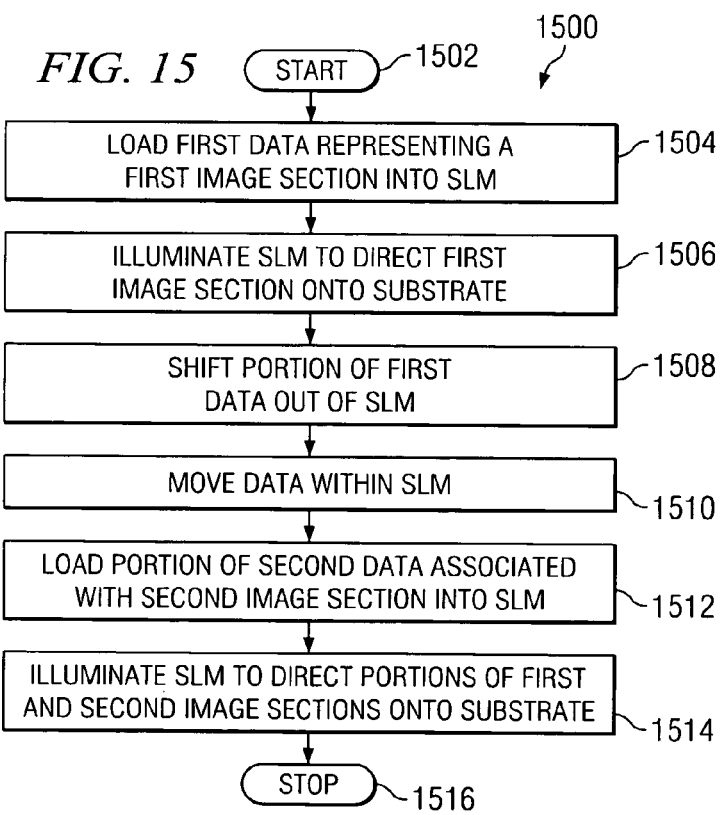

DEFECT MITIGATION IN SPATIAL LIGHT MODULATOR USED FOR DYNAMIC PHOTOLITHOGRAPHY

CROSS-REFERENCE TO RELATED APPLICATIONS

This application is related by subject matter to U.S. application Ser. No. 10/736,730 entitled REAL TIME IMAGE RESIZING FOR DYNAMIC DIGITAL PHOTOLITHOGRAPHY; Ser. No. 10/737,126 entitled SPATIAL LIGHT MODULATOR AND METHOD FOR PERFORMING PHOTOLITHOGRAPHY; and Ser. No. 10/736,090 entitled LIQUID CRYSTAL CELL THAT RESISTS DEGRADATION FROM EXPOSURE TO RADIATION, each filed on an even date herewith.

BACKGROUND OF THE INVENTION

1. Technical Field of the Invention

The present invention relates generally to photolithography, and more specifically, to dynamic photolithography systems.

2. Description of Related Art

Photolithography is a method of transferring a pattern or image onto a substrate. Some industrial uses of photolithography include the manufacture of products, such as flat panel displays, integrated circuits (ICs), IC packaging, planar lightwave circuits (photonics), printed circuit boards, flexible circuits/displays and wafer bumping. In its simplest form, a photolithography system operates by passing light through a mask or tool placed over a substrate having a photosensitive surface, such as a layer of photoresist. Typically, the mask is formed of a transparent material with a fixed opaque pattern inscribed on the surface. Due to the photosensitivity of the substrate surface, when placed in contact with the mask and exposed to light, the pattern inscribed on the mask is transferred onto the substrate surface.

Although the use of a mask provides for a high degree of precision and repeatability, traditional contact photolithography systems suffer from several limitations. One limitation is a manufacturing specification that restricts the size of the substrate to no greater than the size of the mask. For large substrates, it is difficult to produce and handle a mask of sufficient size to cover the entire substrate area. In addition, as technology has progressed, the size of features photolithographically transferred onto the substrate surface has decreased to 0.5 µm or smaller. To achieve such small feature sizes, more advanced systems use projection optics to separate the mask from the substrate, allowing for optical reduction in the transferred feature size. However, in order to transfer the pattern for the entire substrate using an optical reduction system, the size of the mask would necessarily be larger than the size of the substrate. Large masks are both unwieldy and expensive to produce. To overcome the problems associated with large masks, many photolithography systems use multiple masks that contain different portions of the total pattern. The pattern is stitched together on the substrate surface by altering the position of the substrate surface in relation to the mask.

However, the cost to design and embed a pattern on a mask is considerable, and therefore, creating a large number of masks may be cost-prohibitive. Likewise, in applications where frequent changes occur, creating a new mask each time a change occurs may not be cost effective. As a result, dynamic photolithography systems have developed that enable a manufacturer to dynamically change a mask pattern without requiring a new mask for each change. Dynamic photolithography systems commonly employ a spatial light modulator (SLM) to define a pattern that is imaged onto the substrate surface. SLMs are electrically controlled devices that include individually controllable light modulation elements that define pixels of an image in response to electrical signals.

Typically, at feature sizes of 0.5 µm or smaller, there are tens of millions of light modulation elements within an SLM that is not more than a few square centimeters in area. With the small SLM size, multiple exposures are generally required to image the entire area of the substrate. Since the image formed by the SLM is easily reconfigurable, it is a relatively simple process to divide the final image into sections, configure the SLM to transfer one of the image sections onto the appropriate area of the substrate surface, shift the relative position of the substrate and SLM and repeat the process for each image section until the entire image is transferred onto the substrate surface.

However, it is impracticable to assume that the SLM will be free from defects. Statistically, there will be at least a few of the tens of millions of light modulation elements of the SLM that are defective. As a result of the multiple imaging process, each defective light modulation element will produce numerous defects on the substrate surface. What is needed is a mechanism to mitigate the effect of defective light modulation elements.

SUMMARY OF THE INVENTION

Embodiments of the present invention provide a photolithography apparatus for use in a photolithography system. The photolithography apparatus includes light modulation elements operable to photolithographically transfer an image onto a substrate. A first set of the light modulation elements is operable to photolithographically transfer a portion of the image onto an area of a substrate, and a second set of the light modulation elements is operable to photolithographically transfer the portion of the image onto the area of the substrate. The photolithography apparatus further includes memory elements in communication with respective ones of the light modulation elements for storing data representing the portion of the image.

In one embodiment, the image is divided into sections, with each section including multiple subsections. The portion of the image that is transferred by the SLM corresponds to one or more subsections of the image. In a further embodiment, the light modulation elements within the SLM are divided into light modulation banks. Each light modulation bank is capable of transferring one image subsection of the image.

Other embodiments of the present invention provide a process for performing photolithography, in which a spatial light modulator is provided with data representing a portion of an image to be photolithographically transferred onto a substrate. The SLM transfers the portion of the image from a first set of light modulation elements onto an area of the substrate, and from a second set of light modulation elements onto the area of the substrate. During the first transfer, the substrate is positioned in relation to the spatial light modulator to expose the area of the substrate. The relative position of the substrate with respect to the spatial light modulator is altered for the second transfer to expose the area of the substrate with the portion of the image.

By performing optical oversampling of the substrate using multiple image transfers from different sets of light modulation elements, the probability of defects in the transferred pattern as a result of defective light modulation elements is reduced. In addition to reducing defects in the transferred pattern on the substrate, optical oversampling also provides several additional benefits. As a result of oversampling, the total amount of energy is integrated over the multiple exposures, thereby allowing more energy to be impinged on the substrate. Optical oversampling can also be used to achieve grayscale in images when using a binary light modulation element in an SLM, and reduce speckle in laser-based photolithography systems. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show sample embodiments of the invention and which are incorporated in the specification hereof by reference, wherein:

FIGS. 5 and 6 are illustrations of a time-sequence for performing optical oversampling on the substrate by the spatial light modulator, in accordance with embodiments of the present invention;

FIG. 7A is a flow chart illustrating an exemplary photolithography process for performing optical oversampling of the substrate, in accordance with embodiments of the present invention;

FIG. 7B is a flow chart illustrating an exemplary photolithography process for performing multiple transfers of a portion of an image, in accordance with embodiments of the present invention;

FIG. 13 illustrates an exemplary substrate exposure timing sequence;

FIG. 15 is a flow chart illustrating an exemplary method for shifting data within a spatial light modulator to dynamically photolithographically transfer an image onto a substrate.

DETAILED DESCRIPTION OF EXEMPLARY EMBODIMENTS

Figure 1:
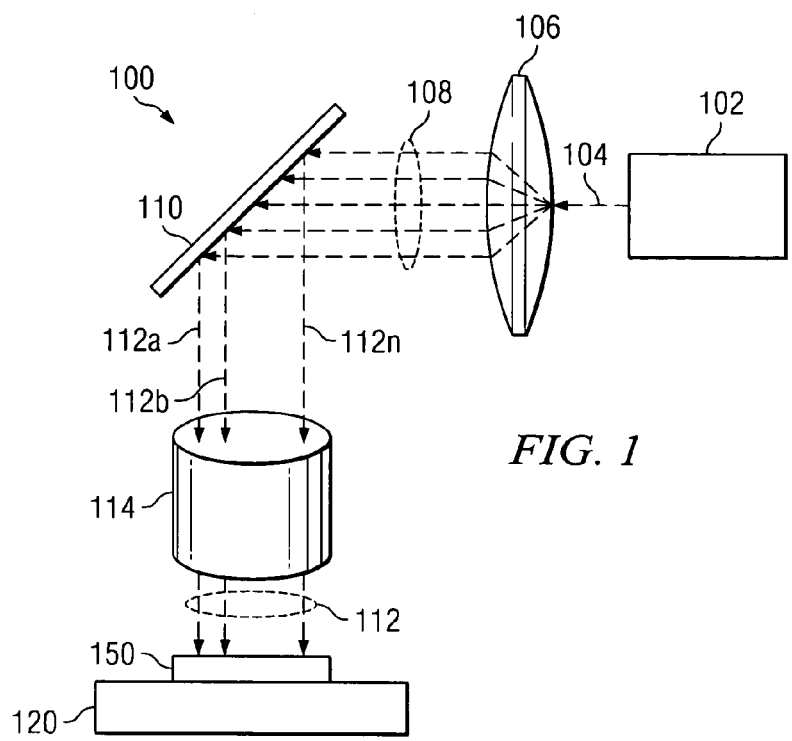
FIG. 1 illustrates a photolithography system utilizing a spatial light modulator to photolithographically transfer an image to a substrate in accordance with embodiments of the present invention.

FIG. 1 illustrates a dynamic photolithography system 100 for photolithographically transferring an image to a substrate 150 in accordance with embodiments of the present invention. The photolithography system 100 includes a light source 102 operable to output light 104. The light source 102 can be a laser, such as an excimer laser, or other non-laser source, as understood in the art. The light source 102 is optically coupled to beam shaping optics 106. The output of the beam shaping optics 106 is light 108 that is directed toward a spatial light modulator 110. The spatial light modulator 110 includes light modulation elements (not shown) operable to selectively transfer the light 108. The light modulation elements are described in more detail below in connection with FIGS. 2A and 2B. In one embodiment, the light modulation elements are liquid crystal elements. However, it should be understood that in other embodiments, the light modulation elements are micromirrors or another type of optical device that can selectively transfer light by reflection, transmission or otherwise.

The output of the spatial light modulator 110 includes dark areas with no light and light areas made up of multiple light beams 112a–112n (collectively 112) that are transferred by selected light modulation elements to form at least a portion of an image containing a pattern. The light beams 112 are directed to projection optics 114, which is optically aligned to direct the light beams 112 onto the substrate 150. A photosensitive layer (not shown), such as a layer of photoresist, is on the surface of the substrate 150. The photosensitive layer reacts in response to the light beams 112 to produce the desired pattern on the surface of the substrate 150. In one embodiment, the substrate 150 is mounted on a scanning stage 120 to move the substrate 150 in any direction relative to the spatial light modulator 110. The scanning stage 120 can be, for example, a high precision scanning stage. In another embodiment, the substrate 150 remains stationary and the optics and/or light beams 112 move relative to the substrate 150. In either configuration, one of the substrate 150 and the spatial light modulator 110 is moved relative to the other to transfer the image onto the substrate 150.

The spatial light modulator 110 further includes pixel drive circuits (not shown) that are uniquely coupled to the light modulation elements. The pixel drive circuits are described in more detail below in connection with FIGS. 2A, 2B and 9. The pixel drive circuits store data that define the state of the light modulation elements. For example, light modulation elements that are reflective can be selectively altered to be in a reflective or non-reflective state such that the received light 108 is either reflected or not reflected onto the substrate 150 by storing data (e.g., logical LOW and HIGH data values) in pixel drive circuits associated with the light modulation elements. In effect, the spatial light modulator 110 operates as a dynamic mask that forms a pattern that is imaged onto the photosensitive layer of the substrate 150.

Figure 2A:
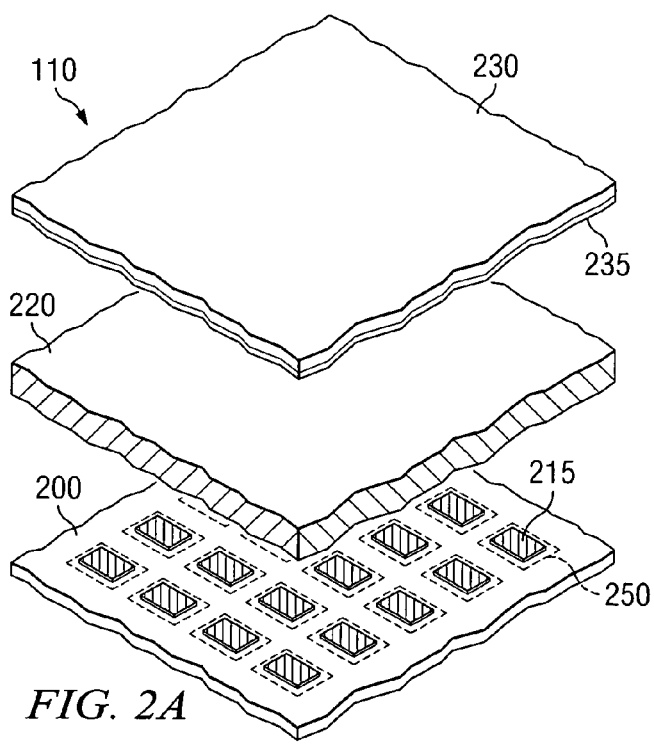
FIG. 2A is an exploded view of a spatial light modulator utilizing liquid crystal light modulation elements.
Figure 2B:
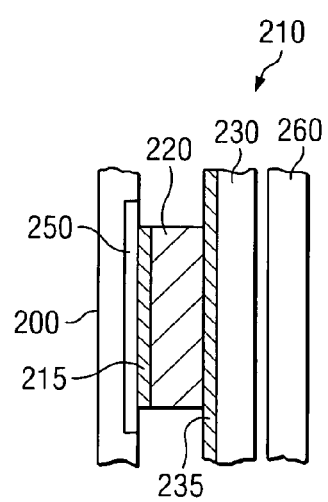
FIG. 2B is a cross-sectional view of a liquid crystal light modulation element of FIG. 2A.

FIGS. 2A and 2B illustrate an example of an SLM 110 with liquid crystal (LC) light modulation elements 210 that define pixels of an image. The SLM in FIGS. 2A and 2B is a liquid crystal on silicon (LCOS) SLM 100 including individual LC light modulation elements 210 that selectively reflect light of a particular polarization to transfer an image of a desired pattern onto a substrate. FIG. 2A is an exploded view of a portion of the LCOS SLM, and FIG. 2B is a cross-sectional view of an LC light modulation element 210 of the LCOS SLM 110. As can be seen in FIG. 2A, the LCOS SLM 110 includes a substrate 200 on which pixel electrodes 215 are located. The pixel electrodes 215 can be arranged in an array of rows and columns or in a nonorthogonal pattern. Within the substrate 200 below each pixel electrode 215 is located a pixel drive circuit 250 connected to drive the overlying pixel electrode 215. Disposed above the substrate 200 is a transparent glass 230 coated with a layer 235 of transparent electrically conductive material, such as indium tin oxide (ITO). The ITO layer 235 is the common electrode of the LCOS SLM 110. Encapsulated between the substrate 200 and the glass 230 is a layer 220 of liquid crystal material that reacts in response to electric fields established between the common electrode 235 and pixel electrodes 215.

Thus, as shown in FIG. 2B, the pixel electrodes 215 in combination with the liquid crystal material 220, common electrode 235, pixel drive circuits 250 and polarizer 260 form respective individual light modulation elements 210 that define pixels of an image. Depending on the voltages applied between the pixel electrodes 215 and common electrode 235, the liquid crystal material 220 reacts at each light modulation element 210 to either change or not change the polarization state of incoming light. The light modulation elements 210 in combination with polarizer 260 of the SLM 110 allow light of a particular polarization to be reflected or not reflected onto the substrate 150 of FIG. 1. It should be understood that polarizer 260 includes one or more polarizers, as known in the art.

In another embodiment, the pixel electrodes 215 can be driven with voltages that create a partial reaction of the liquid crystal material 220 so that the light modulation element 210 is in a non-binary state (i.e., not fully ON or OFF) to produce a "gray scale" reflection. For example, the voltages that create a partial reaction of the liquid crystal material 220 are typically produced by applying signals on the pixel electrode 215 and common electrode 235 that not fully in or out of phase, thereby creating a duty cycle between zero and 100 percent, as understood in the art.

Although only a few light modulation elements 210 are illustrated in FIGS. 2A and 2B, each LCOS SLM 110 typically include tens of millions of light modulation elements. For example, in one embodiment, the LCOS SLM 110 includes a matrix of 16,384 columns by 606 rows of light modulation elements. With such a large number of light modulation elements, it is difficult and expensive to produce a defect-free LCOS SLM 110. In addition, the LCOS SLM 110 is typically not more than a few square centimeters in area.

Figure 3:
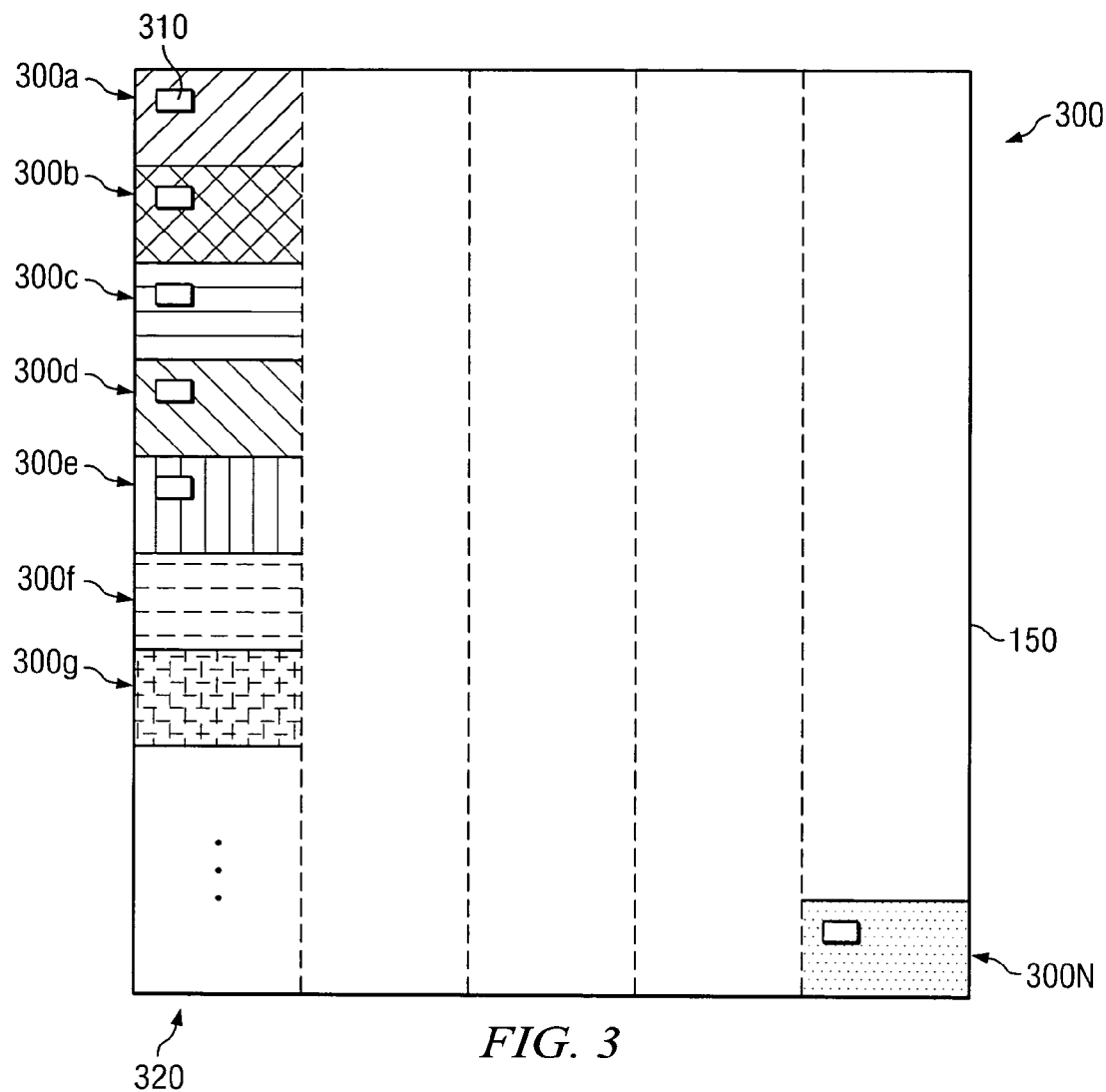
FIG. 3 is an illustration of a substrate that photolithographically receives a transferred image in image sections using the photolithography system of FIG. 1.

Therefore, referring now to FIG. 3, multiple exposures are generally required to image the entire area of the substrate 150. Each exposure transfers a different section 300a–300g . . . 300N of the final image 300 onto a corresponding area 320 of the substrate 150. For large substrates 150, multiple passes over columns 320 of the substrate 150 may be required to image the entire substrate area. With a precision stage, the alignment of each exposure can be carefully controlled to seamlessly stitch the image sections 300a–300g . . . 300N. However, for each defective light modulation element, a corresponding pixel defect 310 appears on the substrate surface. As a result of the multiple exposures, each defective light modulation element produces N pixel defects 310 on the substrate surface, where N is the number of sections 300a–300g . . . 300N the final image 300 is divided into.

Figure 4:
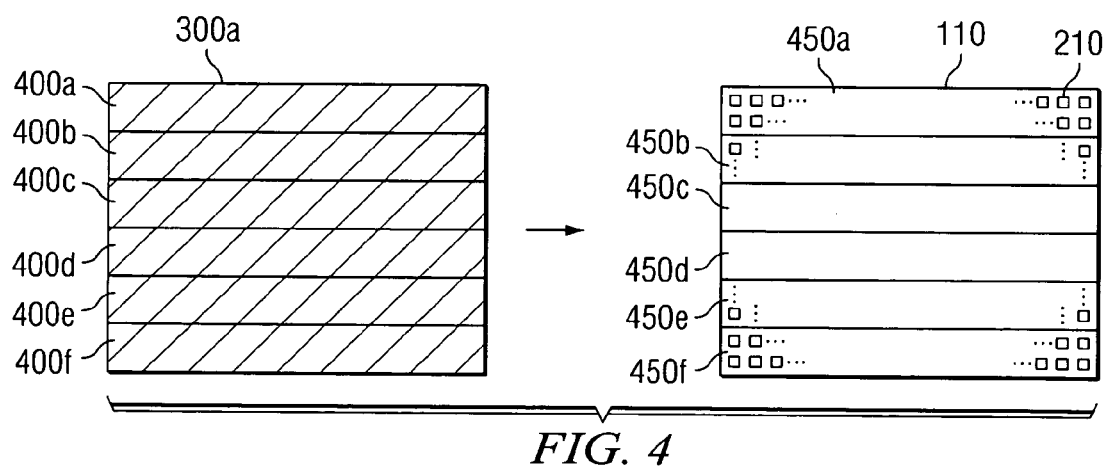
FIG. 4 is an illustration of a mapping of image subsections to light modulation banks within the spatial light modulator.

Therefore, in accordance with embodiments of the invention, as shown in FIG. 4, each image section (e.g., image section 300a from FIG. 3) is divided into image subsections 400a–400f, one or more of which correspond to a portion of the image, and the light modulation elements 210 of the spatial light modulator 110 are logically divided into light modulation banks 450a–450f. In FIG. 4, the light modulation elements 210 of the SLM 110 are shown arranged in rows and columns. The number of rows and columns depends on the application. The light modulation banks 450a–450f can include one or more rows of light modulation elements 210, one or more columns of light modulation elements 210 or any combination thereof. For example, in FIG. 4, the rows of light modulation elements 210 have been divided into six banks of rows 450a–450f. Each bank 450a–450f transfers only one image subsection 400a–400f. Thus, bank 450a transfers image subsection 400a, bank 450b transfers image subsection 400b, and so on. To minimize the effects of defective light modulation elements, each image subsection 400a–400f is transferred onto the substrate multiple times by two or more light modulation banks 450a–450f in the SLM 110. This process is referred to herein as optical oversampling.

Figure 6:
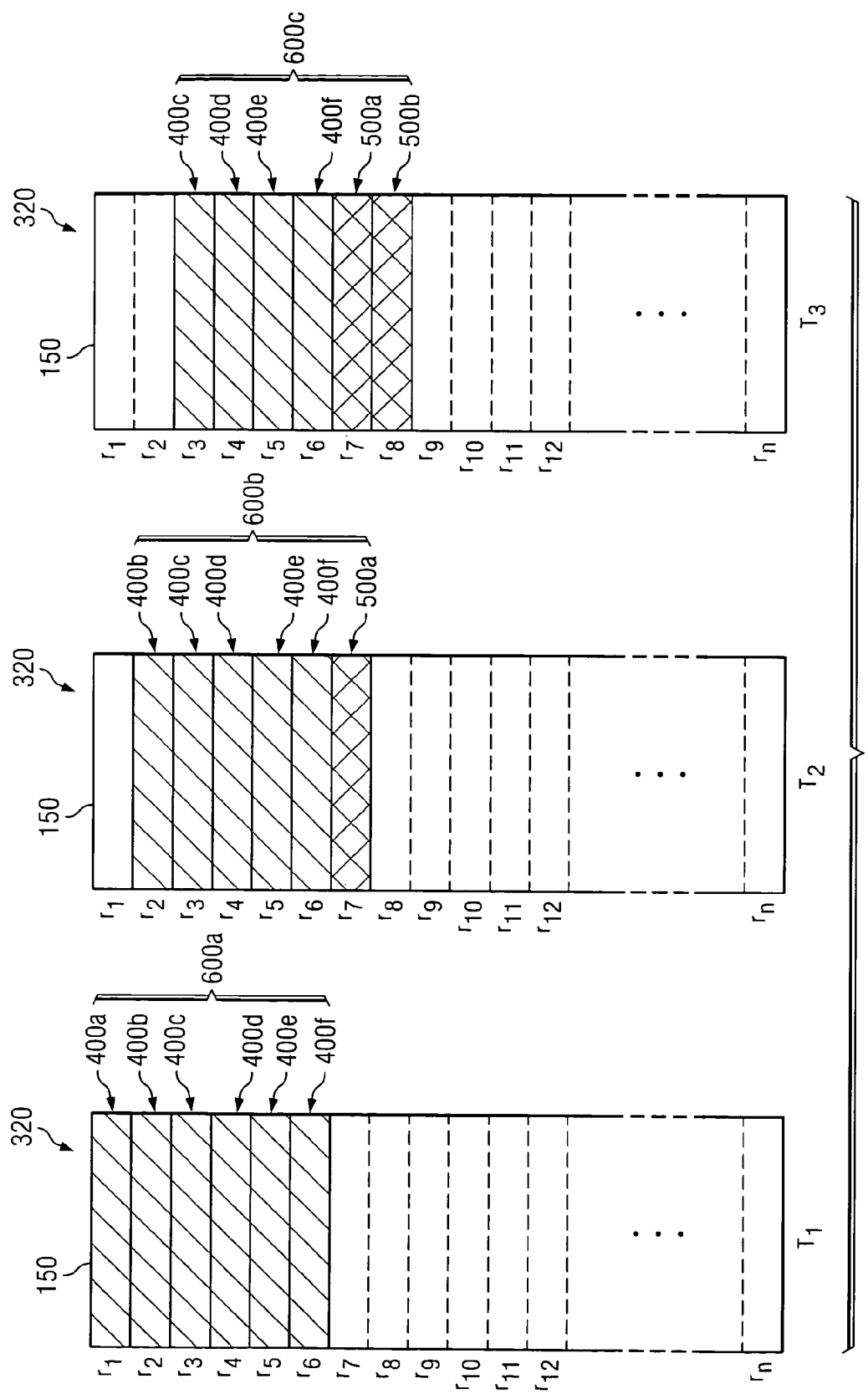

An example of optical oversampling is shown in FIGS. 5 and 6. FIG. 5 illustrates an exemplary SLM 110 for photolithographically transferring image subsections of an image over a time sequence $T_1$–$T_3$, and FIG. 6 illustrates a portion of an exemplary substrate for photolithographically receiving the transferred image subsections of the image over the same time sequence $T_1$–$T_3$. In FIG. 5, at time $T_1$, all of the image subsections 400a–400e of image section 300a are shown loaded into respective banks 450a–450f of the SLM 110 for transfer to the substrate. At time $T_2$, image subsection 400a has been moved out of the SLM 110, while image subsections 400b–400f have been moved to banks 450a–e, respectively, within the SLM 110. In addition, an image subsection 500a of a new image section 300b has been loaded into bank 450f of the SLM 110. At time $T_3$, image subsection 400b has been moved out of the SLM 110, while image subsections 400c–400f have been moved to banks 450a–d, respectively, within the SLM 110. In addition, image subsection 500a of image section 300b has been moved to bank 450e of the SLM 110 and a new image subsection 500b of image section 300b has been loaded into bank 450f of the SLM 110.

Referring now to FIG. 6, a portion (e.g., column 320) of the substrate 150 is shown divided into multiple rows $r_1$–$r_n$. Each row $r_1$–$r_n$ defines an area of the substrate 150 that receives one of the image subsections of the image. Each row $r_1$–$r_n$ is exposed by no more than one of the banks 450a–f (shown in FIG. 5) of the spatial light modulator at any time. In connection with the discussion of FIG. 5, at time $T_1$, a footprint 600a of the SLM 110 is shown to cover six rows $r_1$–$r_6$ of the substrate 150, corresponding to the six banks 450a–450f of the SLM 110. Each row of the substrate 150 within the footprint 600 is exposed by a flash or strobe of an illumination source (e.g., laser 102 of FIG. 1) as a function of the state of the light modulation elements within the banks 450a–f of the SLM. The result is the transfer of image subsections 400a–f onto respective rows $r_1$–$r_6$. At time $T_2$, the substrate 150 has moved relative to the spatial light modulator a distance equivalent to one row, and at the next strobe of the illumination source, the footprint 600b of the SLM 110 is shown to cover six rows $r_2$–$r_7$ of the substrate 150, corresponding to the six banks 450a–450f of the SLM 110. The image subsections 400b–f and 500a stored in banks 450a–450f of the SLM are transferred onto respective rows $r_2$–$r_7$ of the substrate 150. At time $T_3$, the substrate 150 has moved an additional row relative to the spatial light modulator, and at the next strobe of the illumination source, the footprint 600c of the SLM 110 is shown to cover six rows $r_3$–$r_8$ of the substrate 150, corresponding to the six banks 450a–450f of the SLM 110. The image subsections 400c–f and 500a–b stored in banks 450a–450f of the SLM are transferred onto respective rows $r_3$–$r_8$ of the substrate 150. In general, as the rows of the substrate 150 shift upward due to the relative movement between the substrate 150 and the spatial light modulator, the image subsections stored in the light modulation banks of the spatial light modulator shift upward in the light modulation banks accordingly.

By moving the image subsections between banks 450a–450f a distance on the spatial light modulator 110 optically equivalent to the distance that the substrate 150 moves relative to the spatial light modulator 110, each image subsection is transferred separately onto the substrate 150 by each bank, thereby imaging or transferring each image subsection multiple times. Over the course of six exposures (only three of which are shown in FIG. 6), each row (e.g., rows $r_1$–$r_n$) of the substrate 150 is exposed six different times by six different sets of light modulation elements (banks) of the spatial light modulator. This "oversampling" of the substrate of each image subsection minimizes defects in the resulting product as a result of defective "stuck OFF" light modulation elements. In further embodiments, to reduce the number of defects due to defective "stuck ON" light modulation elements, the photosensitive layer on the substrate 150 has a reaction threshold equivalent to two or more exposures.

Thus, even if light modulation bank 450a has a defective ON or OFF light modulation element, it is highly unlikely that the corresponding light modulation element by row and column in each of the remaining banks 450b–f is defective. Therefore, the probability of defects in the resulting transferred pattern on the substrate is low. It should be understood that the number of times that each area of the substrate 150 is exposed is dependent on the number of light modulation elements in the spatial light modulator and the manner in which the spatial light modulator 110 is divided into light modulation banks 450a–450f. Furthermore, depending on the application, the substrate and image subsections can be moved bi-directionally for additional optical oversampling.

In addition to reducing defects in the transferred pattern on the substrate, optical oversampling also provides several other benefits. As a result of oversampling, the total amount of light energy to which the substrate is exposed is integrated over the multiple exposures, thereby allowing more energy to be impinged on the substrate. Optical oversampling can also be used to achieve grayscale in images when using an SLM in which the light modulation elements have a binary characteristic, such that they are either "ON" or "OFF." The image subsections can be modified between exposures to alter the state of the light modulation elements to produce the desired grayscale. Another benefit of optical oversampling is speckle reduction in laser-based photolithography systems. As is understood in the art, due to the coherent nature of the light produced by lasers, interference patterns cause speckles or spatial variations in the light intensity, which can degrade the quality of the lithographic process. Optical oversampling reduces the effect of the speckle pattern on the substrate in the same manner as it reduces the effect of defective light modulation elements.

FIG. 7A is a flow chart illustrating an exemplary photolithography process 700 for performing optical oversampling of the substrate, in accordance with embodiments of the present invention. The photolithography process starts at block 702. At block 704, a substrate having a photoresist layer is positioned in relation to an SLM. At block 706, an area of the photoresist layer is exposed with a portion of an image defined by the states of a first set of light modulation elements of the SLM. At block 708, the relative position of the substrate and SLM is altered. At block 710, the same area of the photoresist layer is exposed with the same portion of the image defined by the states of a second set of light modulation elements of the SLM. In one embodiment, the states of individual light modulation elements within the second set of light modulation elements are the same as the states of corresponding light modulation elements within the first set of light modulation elements. In another embodiment, the states of individual light modulation elements within the second set of light modulation elements are modified relative to the states of corresponding light modulation elements within the first set of light modulation elements. The photolithography process ends at block 712.

FIG. 7B is a flow chart illustrating an exemplary photolithography process 750 for performing multiple transfers of a portion of an image, in accordance with embodiments of the present invention. The photolithography process starts at block 752. At block 754, an SLM is provided with a portion of an image to be photolithographically transferred onto an area of a substrate. At block 756, the SLM transfers the portion of the image onto the area of the substrate using a first set of light modulation elements within the SLM. At block 758, the SLM transfers the portion of the image onto the same area of the substrate using a second set of light modulation elements within the SLM. The photolithography process ends at block 760.

Figure 8:
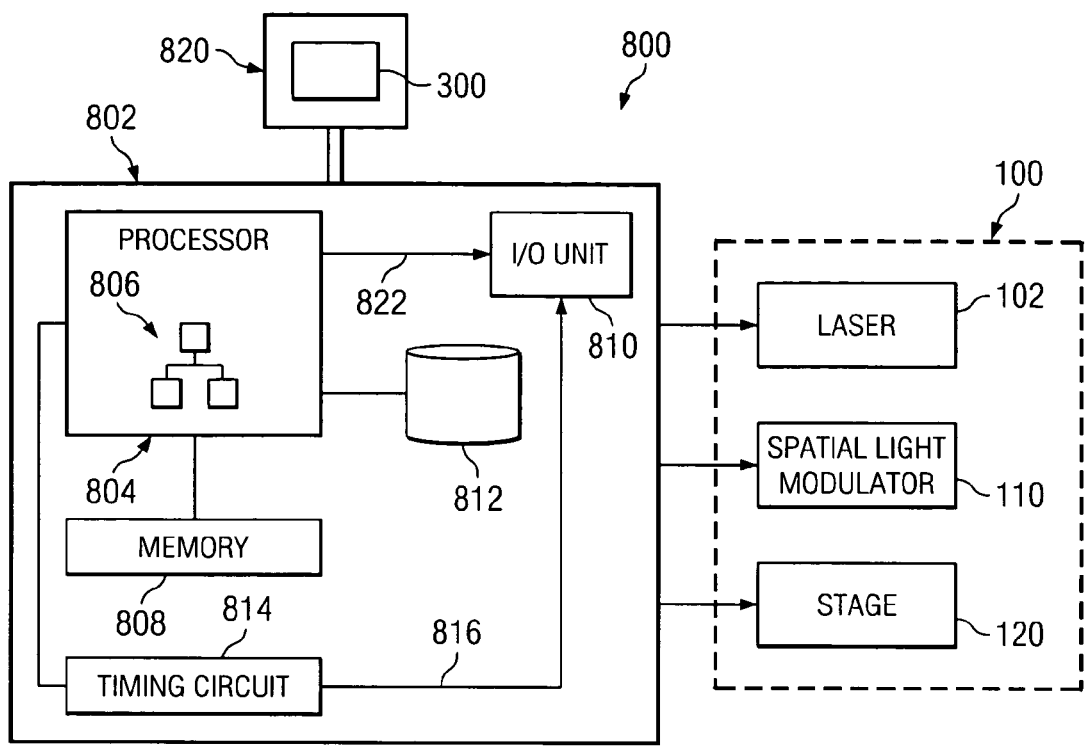
FIG. 8 is a block diagram illustrating a computing system operable to control the photolithography system of FIG. 1.

FIG. 8 is a block diagram illustrating the configuration 800 of a computing system 802 operable to control the photolithography system 100 of FIG. 1. The computing system 802 includes a processing unit 804 operable to execute software 806. The processing unit 804 can be any type of microprocessor, microcontroller, programmable logic device, digital signal processor or other processing device. The processing unit 804 is coupled to a memory unit 808 and input/output (I/O) unit 810. The I/O unit 810 can be wired or wireless. The processing unit 804 is further coupled to a storage unit 812 and timing circuit 814 that generates timing signals 816 for the photolithography system 100. An electronic display 820 is optionally coupled to the computing system 802 and operable to display an image (or portion of an image) 300 that is to be communicated to the spatial light modulator 110 for imaging onto the substrate 150 of FIG. 1.

In one embodiment, the timing signals 816 control the operation of the stage 120, spatial light modulator 110 and laser 102 during exposure cycles. Examples of timing signals 816 include access control signals to sequentially clock data 822 representing a portion of an image 300 into the spatial light modulator 110, strobe or exposure signals to initiate a flash of the laser 102, and other clock signals to drive the spatial light modulator 110, laser 102 and stage 120. The processor 804 communicates with the timing circuit 814 and I/O unit 810 to communicate the data 822 and timing signals 816 to the spatial light modulator 110 and other components of the photolithography system 100, such as the laser 102 and stage 120. For example, during an exposure cycle, data 822 is transmitted from the computing system 802 to the spatial light modulator 110 with an access control signal, and the clock signals drive the SLM 110, stage 120 and laser 102 to alter the state of light modulation elements within the SLM 110 as a function of the data 822, to align the stage 120 with the SLM 110 for image transfer and to control the timing of the strobe or exposure signal to initiate the laser 102 flash.

To implement optical oversampling, the data 822 communicated to the SLM 110 during each exposure cycle includes at least one new image subsection of the image (as shown in FIG. 4). In one embodiment, the data 822 includes both the new image subsection(s) and one or more image subsections transferred to the substrate during the previous exposure cycle. For example, if each image section is divided into six image subsections, the data 822 includes five image subsections previously transferred to the substrate and one new image subsection. However, with potentially tens of millions of light modulation elements, writing the data 822 required to represent all of the image subsections to the SLM 110 each time requires a large amount of data 822 to be communicated between the I/O unit 810 and the SLM 110. As a result of such a large I/O bandwidth, the photolithography system 100 power consumption is high and the throughput speed is limited.

Therefore, in other embodiments, the data 822 communicated to the SLM 110 during each exposure cycle includes only the new image subsection(s) of the image and not any of the previously transferred image subsections in order to reduce bandwidth, thereby reducing power consumption and increasing throughput speed. The image subsections previously transferred to the substrate are stored within the SLM 110 and moved internally within the SLM 110.

Figure 9:
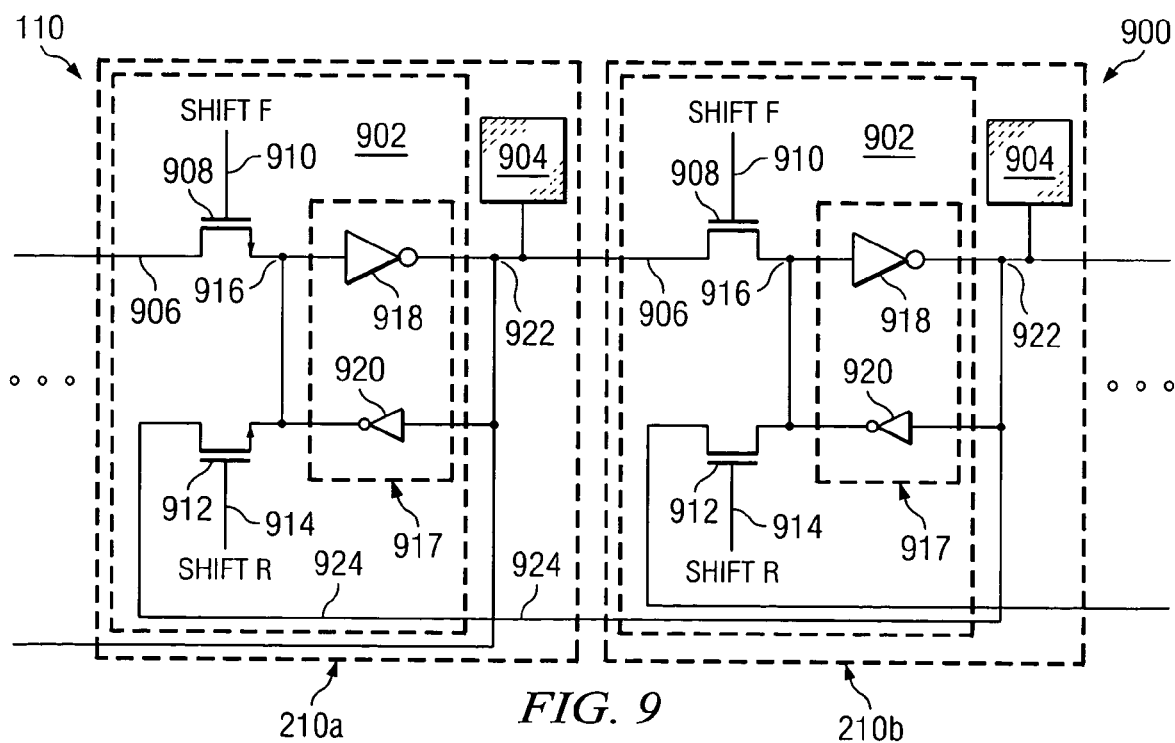
FIG. 9 is a schematic of exemplary spatial light modulator having memory elements in communication with light modulation elements for shifting data through the memory elements, in accordance with embodiments of the present invention.

FIG. 9 is a schematic of a portion of an exemplary spatial light modulator 110 capable of moving data internally during a lithographic process. The SLM includes an array 900 of light modulation elements 210, each including a memory element 902 corresponding to at least a portion of the pixel drive circuit 250 of FIGS. 2A and 2B in communication with an associated pixel controller 904 that is at least party responsible for controlling the state of a pixel defined by the light modulation element 210. In FIG. 9, each memory element 902 is a static memory element that includes an input line 906 and a forward access control element 908. In the example shown, the forward access control element 908 is a transistor having a forward access control line 910 that is operable to control the state of the forward access control element 908 during a shift forward operation. Each memory element 902 further includes a reverse access control element 912 having a reverse access control line 914 operable to control the state of the reverse access control element 912 during a shift reverse operation. Thus, the memory elements 902 are configured to shift data bi-directionally between adjacent columns of the array 900. In addition, although only a single row of light modulation elements 210 within the array 900 is shown, it should be understood that the memory elements 902 can be further configured to shift data between rows and to shift data bi-directionally between adjacent or non-adjacent rows and/or columns of the array 900.

A common node 916 of the forward and reverse access control elements 908 and 912, respectively, is coupled to a memory cell 917. In one embodiment, the memory cell 917 is a bi-stable circuit or static latch utilized to store data representing one pixel of the image. The memory cell 917 is shown implemented as a latch (i.e., a switch and back-to-back inverters) that uses a ripple clock to propagate data between memory cells 917. The ripple clock is described in more detail below with reference to FIGS. 11A and 11B. However, in other embodiments, the memory cell 917 can be implemented as a master-slave flip-flop that does not require a ripple clock to propagate data between the memory cells 917.

Each memory cell 917 includes a forward inverter 918 and a feedback inverter 920. The feedback inverter 920 is a "weak" feedback element that is utilized to reinforce the current state (i.e., LOW or HIGH state) to a stable position. Thus, if the common node 916 is in a low voltage level (i.e., a LOW state), the forward inverter 918 inverts the LOW state to a HIGH state on the output coupled to output node 922. The HIGH state on output node 922 is an input to the feedback inverter 920, which outputs a low voltage level onto node 916. The low voltage level output from the weak feedback inverter 920 reinforces, but does not control, the LOW state on node 916. Similarly, a high voltage level output from the weak feedback inverter 920 reinforces, but does not control, the HIGH state on node 916.

The output node 922 is coupled to the pixel controller 904 and is also the output node of the light modulation element 210. In one embodiment, the pixel controller 904 is a pixel electrode of a LC light modulation element (215, shown in FIGS. 2A and 2B). The voltage level on output node 922 is applied to the pixel electrode of the LC light modulation element to alter the state of the LC light modulation element when the voltage level applied to the pixel electrode differs from a voltage applied to the common electrode 235 of the LC light modulation element. In other embodiments, the pixel controller 904 is an electromechanical device controlling the state or position of a micromirror.

Multiple light modulation elements 210 are electrically interconnected. In one embodiment, the light modulation elements 210 are connected in a shift register configuration, as shown in FIG. 9. In the shift register configuration, the output node 922 of a first light modulation element (e.g., light modulation element 210a) is connected to the input line 906 of a second light modulation element (e.g., light modulation element 210b). The output node 922 of the second light modulation element 210b is connected to the input line of a third light modulation element (not shown), and so on until the output node of the (N−1)th pixel (not shown) is connected to the input line 906 of the Nth pixel (not shown), thereby forming a forward connection network. To load input data into the forward connection network, the input data is provided at the input line 906 of the first light modulation element 210a, and data is shifted from the first light modulation element 210a to the second light modulation element 210b, and so on. It should be understood that a parallel data loading and shifting configuration can be implemented for a reverse connection network, where data is input to the last light modulation element 210 in the array 900.

Figure 10:
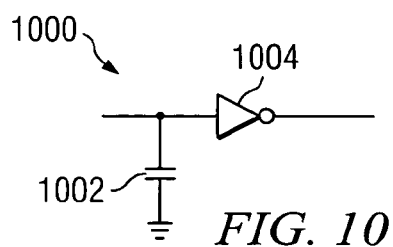
FIG. 10 is a schematic of an alternative memory element for use in the spatial light modulator of FIG. 9.

In another embodiment, as shown in FIG. 10, a conventional dynamic memory cell 800 is used in the spatial light modulator 110 in place of the static memory cell 917 shown in FIG. 9. As shown, the memory cell 800 includes a charge capacitor 802 for storing the data. The charge capacitor 802 is coupled to an inverter 804. However, the memory cell 800 suffers from photoinduced carriers generated by the illumination incident on the silicon of the memory cell 800. The photoinduced carriers tend to increase the charge or voltage value of the charge capacitor 802. The increased charge can cause a low state to unwantingly switch to a high state of the charge capacitor 802. However, care can be taken to minimize the impact of the photogenerated carriers. Physical techniques, such as light shielding, can be used to reduce the magnitude of the problem. Other techniques that rely on gathering the unwanted carriers are described in U.S. Pat. No. 6,586,283, which is herein incorporated by reference. However, to substantially avoid problems associated with photoinduced carriers, the SLM 110 can be designed with the static memory cells 917 shown in FIG. 9.

Figure 11A:
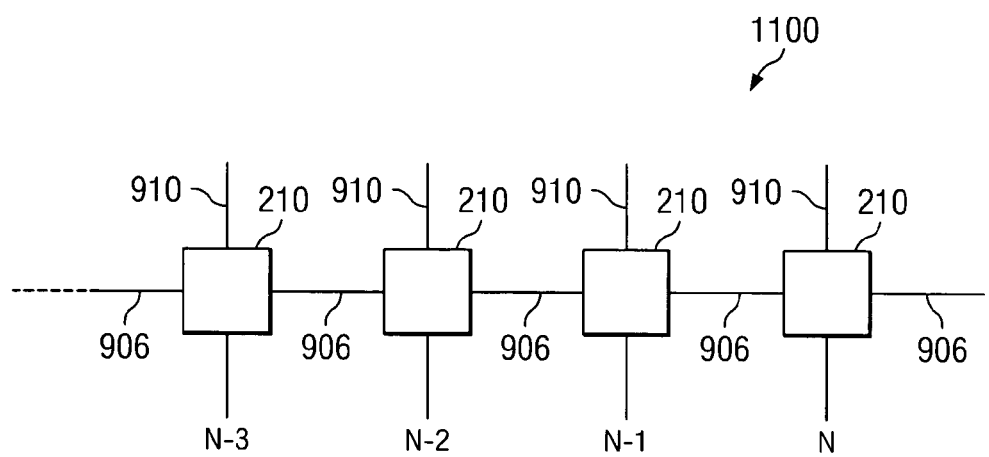
FIG. 11A is a block diagram of an exemplary configuration of the spatial light modulator of FIG. 9.

FIG. 11A is a block diagram of an exemplary configuration 1100 of the light modulation elements 210. The light modulation elements 210 have forward access control lines 910 coupled thereto for causing data on the input lines 906 to propagate through the memory elements 902 (shown in FIG. 9). The light modulation elements 210 can be viewed as elements N, N−1, N−2, N−3, and so forth, where the Nth light modulation element 210 is the last light modulation element and the (N−3)rd light modulation element 210 is the first light modulation element.

Figure 11B:
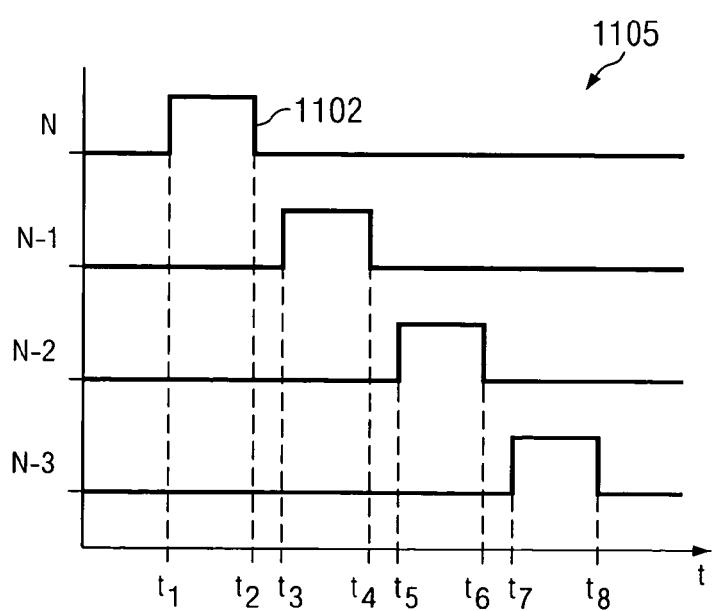
FIG. 11B is a timing diagram for shifting data between the memory elements of FIG. 11A.

FIG. 11B is a timing diagram 1105 for shifting data between the light modulation elements 210 of FIG. 11A. As shown in FIG. 11B, a sequence of non-overlapping pulses, produced by a ripple clock or otherwise, is utilized to shift the data through the light modulation elements. As shown, an access pulse 1102 is applied to the forward access control element 908 of the Nth light modulation element via forward access control 910 line between times $t_1$ and $t_2$ to move data out of the Nth light modulation element. Each of the other access pulses 1102 for the memory elements of the (N−1)th, (N−2)th and (N−3)th light modulation elements are pulsed sequentially such that the data is moved serially from the (N−1)th light modulation element to the Nth light modulation element between times $t_3$ and $t_4$, from the (N−2)th light modulation element to the (N−1)th light modulation element between times $t_5$ and $t_6$ and from the (N−3)th light modulation element to the (N−2)th light modulation element between times $t_7$ and $t_8$ so as to ensure the data is preserved as it is shifted through the light modulation elements. It should be understood that a similar shifting mechanism can be used to shift data in a reverse sequence to enable bi-directional data movement.

When the light modulation elements are liquid crystal elements, as shown in FIGS. 2A and 2B, the net DC value across the liquid crystal elements should be zero to avoid damaging the liquid crystal elements. In embodiments of the present invention, DC balance can be achieved by alternating the voltage on the common electrode and inverting the data between exposure intervals.

Figure 12A:
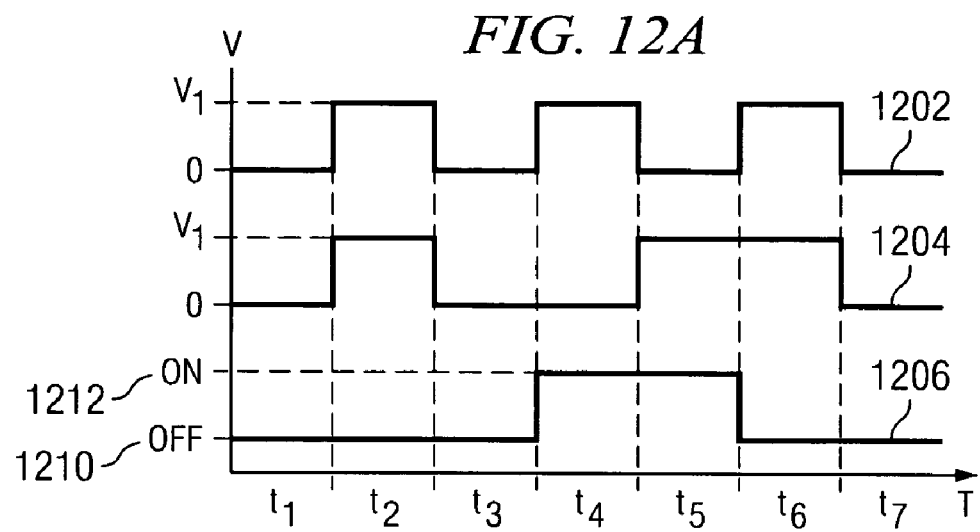
FIG. 12A is a timing diagram that illustrates exemplary control signals for controlling liquid crystal light modulation elements and maintaining DC balance.

For example, FIG. 12A is a timing diagram that illustrates an alternating common electrode voltage 1202. As understood in the art, the state of a liquid crystal element is determined by the potential difference between the common electrode and the pixel electrode. In the example shown, an OFF state 1210 is one where no potential difference exists between a common electrode signal 1202 and a pixel electrode signal 1204, and therefore no electric field is created, allowing the light to be reflected onto the substrate 150. In an ON state 1212 (i.e., when there is a potential difference between the common electrode signal 1202 and the pixel electrode signal 1204), an electric field is created, and the light is not reflected onto the substrate 150. In other configurations, the ON and OFF states can be reversed.

The sign of the electric field depends on the values of the common electrode signal 1202 and the pixel electrode signal 1204. For example, the electric field can be obtained by placing either the pixel electrode signal 1204 at zero potential and the common electrode signal 1202 at unit potential (corresponding to logical one) or by placing the common electrode signal 1202 at zero potential and the pixel electrode signal 1204 at unit potential. In either case, a potential difference exists between the common electrode and the pixel electrode, and hence in the example shown in FIG. 12A, the electric field is non-zero and the liquid crystal element is in an ON state. Although the sign of the electric field is unimportant in determining the state of the liquid crystal element, the net value of the electric field should average to zero to avoid ionization of the liquid crystal elements.

As shown in FIG. 12A, during time interval t1, the common electrode signal 1202 has a voltage level of zero volts and the pixel electrode signal 1204 has a voltage level of zero volts. Because the voltage difference between the common and pixel electrode signals 1202 and 1204 is zero, the pixel state 1206 of the liquid crystal element is OFF 1210. During time intervals $t_2$ and $t_3$, the voltage differential between the common electrode signal 1202 and pixel electrode signal 1204 is also zero volts, thereby maintaining the pixel state 1206 at the OFF state 1210. During time intervals $t_4$ and $t_5$, the voltage differential between the common electrode signal 1202 and pixel electrode signal 1204 causes the pixel state 1206 to be ON 1212. However, the ON state 1212 is achieved by alternating the common electrode signal 1202 with respect to the pixel electrode signal 1204, and therefore, the sign of the electric field is opposite at times $t_4$ and $t_5$. Therefore, DC balance is maintained. During time intervals $t_6$ and $t_7$, the pixel state 1206 is again at OFF 1210.

Figure 12B:
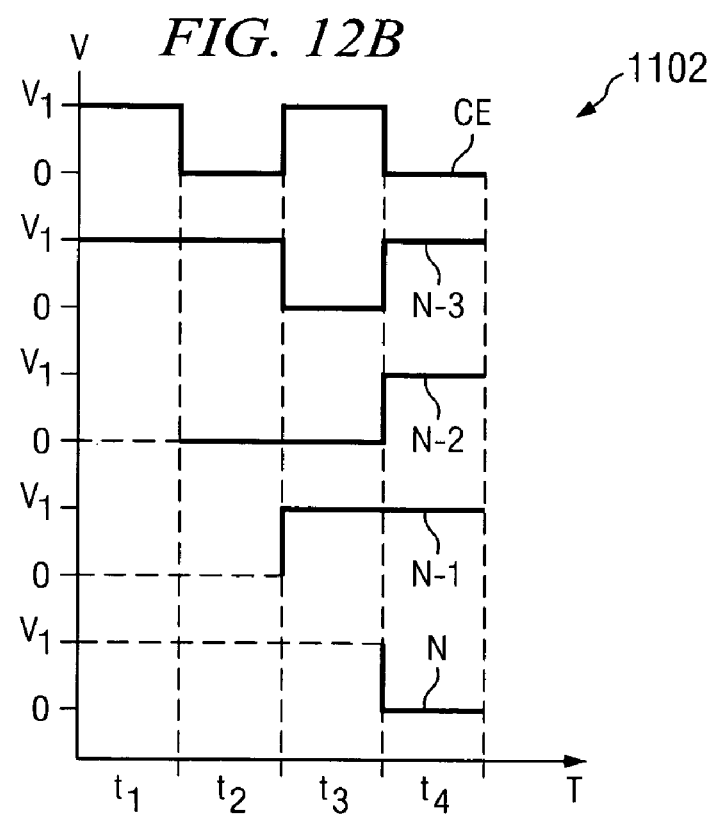
FIG. 12B illustrates a data shifting technique to maintain DC balance in liquid crystal light modulation elements.

Since the common electrode is alternating with each data shift to maintain DC balance, a data inversion technique is needed to shift the data through the liquid crystal elements to preserve the correct pixel state for optical oversampling of the image. FIG. 12B illustrates an exemplary data inversion technique. FIG. 12B uses the exemplary pixel configuration shown in FIG. 11A to illustrate the shifting of data through the liquid crystal elements. As can be seen in FIG. 12B, the voltage level (logical state) of the common electrode signal 1102 alternates over times $t_1$–$t_4$. As the data corresponding to the pixel electrode signal is propagated through the liquid crystal elements from the (N−3)th liquid crystal element to the (N−2)th liquid crystal element to the (N−1)th liquid crystal element to the Nth liquid crystal element, the logical state of the pixel electrode signal inverts with each shift to maintain the same pixel state. For example, at time $t_1$, the common electrode signal is in a logical one state, while the pixel electrode signal at the (N−3)th liquid crystal element is also in a logical one state. Therefore, no electric field is created at the (N−3)th liquid crystal element at time $t_1$, and the (N−3)th liquid crystal element is in an OFF state. At time $t_2$, the data has shifted from the (N−3)th liquid crystal element to the (N−2)th liquid crystal element to cause the (N−2)th liquid crystal element to be in the same state at time $t_2$ (OFF state) as the (N−3)th liquid crystal element was at time $t_1$. However, to maintain DC balance, the common electrode signal has inverted at time $t_2$ to be in a zero logical state. Therefore, when the data is shifted from the (N−3)th liquid crystal element to the (N−2)th liquid crystal element, the data is inverted, such that the (N−2)th liquid crystal element at time $t_2$ is also in a zero logical state, thereby allowing the (N−2)th liquid crystal element to be in an OFF state at time $t_2$. Referring again to FIG. 9, such a data inversion technique is performed by the inverter 918 within the memory cells 917.

FIG. 13 illustrates an exemplary substrate exposure timing sequence using optical oversampling and data shifting.

FIG. 13 shows a series of LC settling intervals 1302a–1302e (collectively 1302) during which the LC material settles after exposure. At the end of each LC settling interval 1302, the laser is flashed (represented by 1310). Between each LC settling interval 1302, there are transition time intervals tt$_1$–tt$_5$. During each of the transition time intervals tt$_1$–tt$_5$, data is moved between the memory elements within the SLM in preparation for the next exposure. The timing circuit 814 (shown in FIG. 8) can be utilized to generate the timing signals to drive the data propagation via the access control signals on the access control lines 910 (shown in FIG. 9), common electrode signal 1202 (shown in FIGS. 12A and 12B), and clock signal (not shown) to control the SLM, stage and laser.

The common electrode signal 1302 alternates between each time interval tt$_1$–tt$_5$. The transition intervals 1308a–1308e of the common electrode signal 1302 occur during the time intervals tt$_1$–tt$_5$ after the laser flashes 1310. In FIG. 13, two exemplary pixel electrode signals 1304 and 1306 are shown, where pixel electrode signal 1304 is illustrative of an ON liquid crystal element and pixel electrode signal 1306 is illustrative of an OFF liquid crystal element. The pixel electrode signal 1304 at each laser flash 1310 has the same potential on the pixel electrode as the common electrode and the pixel electrode signal 1306 has the opposite potential on the pixel electrode as the common electrode at the laser flashes 1310. During the transition time intervals tt$_1$–tt$_5$, data inversions are performed as data is shifting through the memory array to maintain DC balance of the liquid crystal elements. In one embodiment, the data is shifted between the memory elements of the liquid crystal elements during the transition time intervals tt$_1$–tt$_5$ in about 60 microseconds, which allows 940 microseconds of a one millisecond duty cycle for the liquid crystal material to respond to the electric field applied between the pixel electrode and the common electrode. A twenty-nanosecond (20 ns) flash of the laser 1310 occurs at the end of the LC settling intervals 1302 after the liquid crystal material has transitioned. It should be understood that other timings can be established to increase or decrease the LC settling intervals 1302 and data shifting rates based on the transition rate of the liquid crystal material and speed of the substrate moving with respect to the spatial light modulator.

Figure 14:
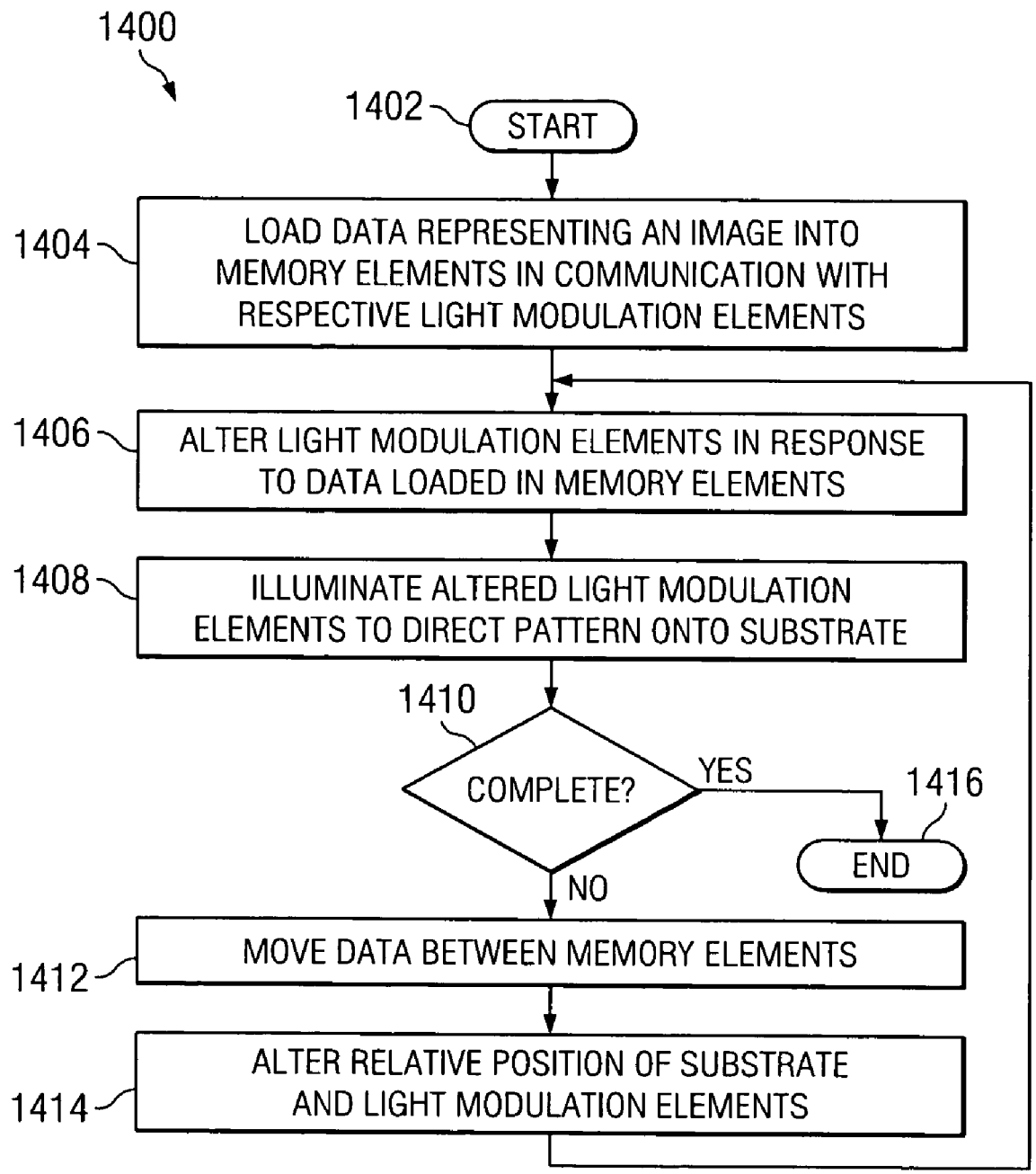
FIG. 14 is a flow chart illustrating an exemplary method to dynamically photolithographically transfer an image onto a substrate by internally moving data.

FIG. 14 is a flow chart illustrating an exemplary process 1400 to dynamically photolithographically transfer an image onto a substrate by internally moving data. The photolithography process starts at block 1402. At block 1404, data representing an image is loaded into memory elements in communication with respective light modulation elements within a spatial light modulator. At block 1406, the light modulation elements are altered in response to the data loaded in the memory. The altered light modulation elements are illuminated to direct an illumination pattern onto the substrate at block 1408. At block 1410, a determination is made whether the image has been transferred a requisite number of times. If not, the data is moved between the memory elements at block 1412, and the relative positioning of the substrate and light modulation elements is altered at block 1414. The process repeats to block 1406 to alter the light modulation elements again in response to the data as moved in the memory elements. If the image has been transferred the requisite number of times at block 1410, the photolithography process ends at block 1416.

FIG. 15 is a flow chart illustrating an exemplary process 1500 for shifting data within a spatial light modulator to dynamically photolithographically transfer an image onto a substrate. The photolithography process starts at block 1502. At block 1504, first data representing a first section of an image is loaded into a spatial light modulator. At block 1506, the spatial light modulator is illuminated to direct the first section of the image onto the substrate. A portion of the first data is moved out of the spatial light modulator at block 1508, the remaining data is moved within the SLM at block 1510 and a portion of second data representing a second section of the image is loaded into the spatial light modulator at block 1512. At block 1514, the spatial light modulator is illuminated to direct portions of the first and second image sections onto the substrate. The photolithography process ends at block 1516.

The innovative concepts described in the present application can be modified and varied over a wide rage of applications. Accordingly, the scope of patented subject matter should not be limited to any of the specific exemplary teachings discussed, but is instead defined by the following claims.

We claim:

1. A method for performing photolithography, comprising:
   providing a spatial light modulator with data representing a portion of an image to be photolithographically transferred to a substrate, the spatial light modulator comprising light modulation elements;
   transferring the portion of the image from a first set of the light modulation elements onto an area of the substrate; and
   transferring the portion of the image from a second set of the light modulation elements onto the area of the substrate;
   wherein the area is an area corresponding to the portion of the image and selected to bear the portion of the image, wherein the data includes a set of data that defines the portion of the image, and wherein, for each said transferring, the associated set of light modulation elements uses said set of data to transfer the portion of the image onto the area.

2. The method according to claim 1, further comprising:
   dividing the image into image sections; and
   dividing the image sections into image subsections, the portion of the image transferred to the substrate corresponding to at least one of the image subsections.

3. The method according to claim 2, further comprising:
   dividing the light modulation elements into light modulation banks, each light modulation bank being capable of transferring one of the image subsections.

4. The method according to claim 1, wherein said transferring the portion of the image from the first set of light modulation elements further comprises: loading the set of data into the first set of light modulation elements; and
   Altering the state of ones of the first set of light modulation elements in response to the set of data.

5. The method according to claim 4, wherein the first set of light modulation elements includes a defective light modulation element, and wherein said transferring the portion of the image from the second set of light modulation elements further comprises:
   placing one of the light modulation elements in the second set of light modulation elements corresponding to the defective light modulation element in the first set of light modulation elements in the correct state as a function of the set of data loaded into the second set of light modulation elements.

6. The method of claim 1, further comprising:
transferring the portion of the image from at least a third set of the light modulation elements onto the area of the substrate.

7. A method for performing photolithography, comprising:
positioning a substrate having a photosensitive surface in relation to a spatial light modulator comprising light modulation elements;
exposing an area of the photosensitive surface with a portion of an image in responses to respective states of a first set of the light modulation elements;
altering the positional relationship between the substrate and the spatial light modulator; and
exposing the area of the photosensitive surface with the portion of the image in response to respective states of a second set of the light modulation elements;
wherein the area is an area corresponding to the portion of the image and selected to bear the portion of the image, wherein the portion of the image is defined by a set of data, and wherein, for each said exposing, the associated set of light modulation elements uses said set of data to expose the area with the portion of the image.

8. The method according to claim 7, further comprising:
achieving grayscale in the image on the area of the photosensitive surface using both said exposings.

9. The method according claim 7, further comprising:
integrating the total energy from each said exposing on the area of the photosensitive surface.

10. The method according to claim 7, further comprising:
exposing the area of the photosensitive surface with the portion of the image in response to respective states of a third set of the light modulation elements.

11. A photolithography apparatus, comprising:
light modulation elements, including a first set of said light modulation elements to photolithograhically transfer a portion of an image onto an area of a substrate, and a second set of said light modulation elements photolithographically transfer the portion of the image onto the area of a substrate; and
memory elements in communication with respective ones of said light modulation elements, said memory elements being configured to store data representing the portion of the image;
wherein the area is an area corresponding to the portion of the image and selected to bear the portion of the image, wherein the data includes a set of data that defines the portion of the image, and wherein, for each said transfer, the associated set of light modulation elements uses said set of data to transfer the portion of the image onto the area.

12. The photolithography apparatus according to claim 11, wherein the image is divided into image sections and the image sections are divided into image subsections, and the portion of the image corresponds to one of the image subsections.

13. The photolithography apparatus according to claim 12, wherein said light modulation elements are divided into sections, each light modulation element section being capable of transferring one of the image subsections, the first set of light modulation elements being one of the light modulation element sections and the second set of light modulation elements being another one of the light modulation element sections.

14. The photolithography apparatus according to claim 13, wherein said light modulation elements are arranged in an array having rows and columns.

15. The photolithography apparatus according to claim 14, wherein the first and second sets of light modulation elements include one or more respective ones of the rows.

16. The photolithography apparatus according to claim 14, wherein the first and second sets of light modulation elements include one or more respective ones of the columns.

17. The photolithography apparatus according to claim 11, wherein said light modulation elements comprise liquid crystal material.

18. The photolithography apparatus according to claim 17, wherein said light modulation elements further comprise:
a common electrode configured to receive a common electrode signal for said light modulation elements; and
pixel electrodes configured to receive the data stored in said respective memory elements.

19. The photolithography apparatus according to claim 11, wherein said light modulation elements comprise micromirrors.

20. The photolithography apparatus according to claim 11, wherein the first set of light modulation elements includes a defective light modulation element, and wherein one of the light modulation elements in the second set of light modulation elements corresponding to the defective light modulation element in the first set of light modulation elements is not defective.

21. The photolithography apparatus according to claim 11, wherein a third set of light modulation elements is operable to photolithographically transfer the portion of the image onto the area of the substrate.

22. A photolithography system for transferring an image to a substrate having a photosensitive surface, said system comprising:
a spatial light modulator including a first set of light modulation elements to transfer a portion of an image onto an area of a substrate,
and a second set of light modulation elements to transfer the portion of the image onto the area of a substrate; and
a stage operable to move one of said spatial light modulator and the substrate relative to the other;
wherein the area is an area corresponding to the portion of the image and selected to bear the portion of the image, wherein the portion of the image is defined by a set of data, and wherein, for each said transfer, the associated set of light modulation elements uses said set of data to transfer the portion of the image onto the area.

23. The photolithography apparatus according to claim 22, further comprising:
a laser optically coupled to said spatial light modulator to illuminate said spatial light modulator with light.

24. The photolithography apparatus according to claim 23, wherein the first and second sets of light modulation elements minimize spatial variations in the intensity of the light transferred to the substrate.

25. The photolithography system according to claim 22, wherein the light modulation elements further include respective memory elements configured to store the set of data, the light modulation elements being alterable in response to the data stored in the respective memory elements.

* * * * *

UNITED STATES PATENT AND TRADEMARK OFFICE
CERTIFICATE OF CORRECTION

PATENT NO.       : 7,133,116 B2                                     Page 1 of 1
APPLICATION NO.  : 10/736724
DATED            : November 7, 2006
INVENTOR(S)      : Nishimura et al.

It is certified that error appears in the above-identified patent and that said Letters Patent is hereby corrected as shown below:

In column 16, line 51, in Claim 23, delete "apparatus" and insert -- system --, therefor.

In column 16, line 56 (Approx.), in Claim 24, delete "apparatus" and insert -- system --, therefor.

Signed and Sealed this

Twenty-seventh Day of November, 2007

JON W. DUDAS
*Director of the United States Patent and Trademark Office*